United States Patent
Ko et al.

(10) Patent No.: US 7,863,947 B2
(45) Date of Patent: Jan. 4, 2011

(54) DRIVING STRENGTH CONTROL CIRCUIT AND DATA OUTPUT CIRCUIT IN SEMICONDUCTOR DEVICE

(75) Inventors: Bok Rim Ko, Seoul (KR); Youk Hee Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 188 days.

(21) Appl. No.: 12/215,722

(22) Filed: Jun. 30, 2008

(65) Prior Publication Data

US 2009/0230996 A1    Sep. 17, 2009

(30) Foreign Application Priority Data

Mar. 17, 2008  (KR) .................. 10-2008-0024580

(51) Int. Cl.
  *H03K 19/003*  (2006.01)
  *H03K 19/08*  (2006.01)
  *G11C 11/4096*  (2006.01)

(52) U.S. Cl. .................. 327/112; 327/108; 327/525; 326/82; 326/91; 365/230.06

(58) Field of Classification Search .................. None
  See application file for complete search history.

(56) References Cited

U.S. PATENT DOCUMENTS

| 7,079,425 B2 * | 7/2006 | Chun .................. 365/189.15 |
| 7,091,768 B2 * | 8/2006 | Lee .................. 327/525 |
| 7,355,453 B2 * | 4/2008 | Watt .................. 326/87 |
| 2008/0008283 A1 | 1/2008 | Lee |

FOREIGN PATENT DOCUMENTS

| KR | 10-2005-0028076 A | 3/2005 |
| KR | 10-2005-0055226 A | 6/2005 |

* cited by examiner

*Primary Examiner*—Lincoln Donovan
*Assistant Examiner*—Terry L Englund
(74) *Attorney, Agent, or Firm*—John P. White; Cooper & Dunham LLP

(57) ABSTRACT

A driving strength control circuit and a data output circuit for controlling driving strength of a data driver based on a user's demand are provided to make it possible to control the driving strength through a fuse cutting. The driving strength control circuit includes a fuse signal generating unit for generating a fuse signal based on a fuse cutting, a select signal generating unit for generating select signals in response to the fuse signal, a driving control signal generating unit for receiving set-up signals and generate driving control signals in response to the select signals, and a driving signal generating unit for driving signals by decoding the driving control signals.

38 Claims, 6 Drawing Sheets

DRIVING STRENGTH CONTROL CIRCUIT AND DATA OUTPUT CIRCUIT IN SEMICONDUCTOR DEVICE

TECHNICAL FIELD

This disclosure relates to a data output circuit and, more particularly, to a driving strength control circuit capable of adjusting driving strength in compliance with user's demand.

BACKGROUND

Generally, a semiconductor memory device includes a data input unit for inputting data, a core region to process the data transferred from the data input unit, and a data output unit for outputting to an external circuit the processed data from the core region.

Data input pads and data output pads are also included in the semiconductor memory device to support data input and output operations. The data input and output units are connected to data input and output pads, respectively. Recently, a pad through which the data can be inputted and outputted is widely used in order to reduce the number of pads in the semiconductor device.

The data transmission is carried out with a sufficiently large signal, when the data are transferred to the semiconductor memory device; however, when the data processed in the core region are outputted with a weak signal, the data output unit should have a large driving strength in order to pull up and down a load to an external circuit based on the data transferred from the core region. Accordingly, a data driver has to be involved in the data output unit.

Recently, in a case of mobile DRAM, the driving strength of the data driver is controlled by EMRS (Extended Mode Register Set) signal. A first driving strength, a second driving strength, a third driving strength and a fourth driving strength are respectively denoted as "FULL", "HALF", QUARTER" and "OCTANT" in the specification. Here, the first driving strength (FULL) means the full driving strength available to drive the data, the second driving strength (HALF) is a half of the full driving strength, the third driving strength (QUARTER) is a quarter dose or one-fourth of the full driving strength, and the fourth driving strength (OCTANT) is an eighth of the full driving strength.

In a case that the driving strength of the data driver is designed to be only the first driving strength (FULL), the second driving strength (HALF), the third driving strength (QUARTER) and the fourth driving strength (OCTANT), the semiconductor memory device does not meet the user's demand precisely. That is, when the user wants to control the data driver with a driving strength which is different from that prescribed in the specification (for example, the user wants to control the data driver with three-fourths of the first driving strength (FULL)), it is not possible to obtain such a driving strength and the variation of the driving strength is limited to a specific option of the prescribed driving strength.

SUMMARY

In an aspect of this disclosure, a driving strength control circuit and a data output circuit are provided for controlling a driving strength of a data driver based on a user's demand to make it possible to control the driving strength, to one that is other than the specification prescribes, through fuse cutting.

In an embodiment, a strength control circuit in semiconductor device comprises a fuse signal generating unit for generating a fuse signal based on fuse cutting, a select signal generating unit for generating select signals in response to the fuse signal, a driving control signal generating unit for receiving set-up signals and generate driving control signals in response to the select signal, and a driving signal generating unit for generating driving signals by decoding the driving control signals.

The fuse signal generated by the fuse signal generating unit is activated when the fuse is cut.

The fuse signal generating unit includes a fuse connected between a power supply voltage terminal and a first node, a first pull-down element connected between the first node and a ground voltage terminal for performing a pull-down operation at the first node in response to a power-up signal, an inverter for inverting a voltage signal on the first node and outputting an inverted signal to a second node, a second pull-down element for performing a pull-down operation at the first node in response to a voltage signal on the second node, and a buffer for outputting the fuse signal by buffering the voltage signal on the second node.

The set-up signals include first to third set-up signals and the select signal generating unit includes a set-up signal detecting unit for receiving the first to third set-up signals and then generate an enable signal, a logic unit for controlling a transmission of the fuse signal in response to the enable signal, and a buffer for producing the select signals and an inverted select signal by buffering an output signal of the logic unit.

The enable signal generated by the set-up signal detecting unit is activated when the first to third set-up signals are inputted according to a predetermined combination.

The driving control signal generating unit includes a first driving control signal generator for generating a first driving control signal from the first set-up signal in response to the select signals, a second driving control signal generator for generating a second driving control signal from the second set-up signal in response to the select signals, and a third driving control signal generator for generating a third driving control signal from the third set-up signal in response to the select signals.

The first driving control signal generator includes a first transfer unit for inverting the first set-up signal and transferring an inverted signal of the first set-up signal, as the first driving control signal, in response to the select signals, and a second transfer unit for transferring the first set-up signal, as the first driving control signal, in response to the select signals.

The first transfer unit includes a switch for selectively transferring the first set-up signal or a ground voltage, and an inverter driven by the select signals, for inverting an output signal of the switch.

The second driving control signal generator includes a first transfer unit for inverting the second set-up signal and transferring an inverted signal of the second set-up signal, as the second driving control signal, in response to the select signals, and a second transfer unit for transferring the second set-up signal, as the second driving control signal, in response to the select signals.

The first transfer unit includes a switch for selectively transferring the second set-up signal or a ground voltage, and an inverter driven by the select signals, for inverting an output signal of the switch.

The third driving control signal generator includes a first transfer unit for inverting the third set-up signal and transferring an inverted signal of the third set-up signal, as the third driving control signal, in response to the select signals, and a second transfer unit for transferring the third set-up signal, as the third driving control signal, in response to the select signals.

The first transfer unit includes a switch for selectively transferring the third set-up signal or a ground voltage, and an inverter driven by the select signals, for inverting an output signal of the switch.

The driving control signals include first to third driving control signals, wherein the driving signals include first to fourth driving signals, and wherein the driving signal generating unit includes a pre-decoder for generating first to third decoding signals by pre-decoding the first to third driving control signals, and a decoder for generating the first to fourth driving signals by decoding the first to third decoding signals and the first to third driving control signals.

The pre-decoder includes a first pre-decoder for generating the first decoding signal by inverting the third driving control signal, a second pre-decoder for generating the second decoding signal by performing a logic operation of the second driving control signal and the first decoding signal, and third pre-decoder for generating the third decoding signal by performing a logic operation of the first driving control signal and the first decoding signal.

The first pre-decoder includes a switch for selectively transferring the third driving control signal or a ground voltage, and an inverter for inverting an output signal of the switch.

The decoder includes a first decoder and wherein the first decoder includes a first logic element for generating a fourth decoding signal by using the third decoding signal and the first and second driving control signals, and a second logic element for generating the third driving signal by using the first decoding signal and the fourth decoding signal.

The decoder includes a second decoder for generating the first driving signal in response to the second to fourth decoding signals, a third decoder for generating the second driving signal by using the first, third and fourth decoding signals, and a fourth decoder for generating the fourth driving signal by using the third driving control signal.

The second decoder includes a logic element for performing a logic operation of the second to fourth decoding signals, a switch for selectively transferring the fourth decoding signal or a ground voltage, and a logic unit for performing a logic operation of an output signal of the logic element and an output signal of the switch.

The fourth decoder includes a switch for selectively transferring the third driving control signal or a ground voltage, and a buffer unit for buffering an output signal of the switch.

The set-up signals are set up by an EMRS (Extended Mode Register Set) signal.

In another embodiment, a data output circuit in a semiconductor device comprises a driving strength control unit for receiving set-up signals which are set up by an EMRS (Extended Mode Register Set) signal and generate driving signals based on fuse cutting, a data driver for receiving the driving signals, a driving strength of the driver being controlled based on the driving signals, and a data output pad for outputting data which are driven by the data driver.

The data driver includes first and second driving units to drive a data output terminal in response to pull-up and pull-down signals, wherein the driving signals include first and second driving signals, and wherein the first and second driving units are respectively driven in response to the first and second driving signals.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF THE PREFERRED EMBODIMENTS

Hereinafter, the present invention will be described in detail through examples and embodiments. The examples and embodiments merely exemplify the present invention, and the scope of this disclosure and the appended claims is not limited by them.

Figure 1:
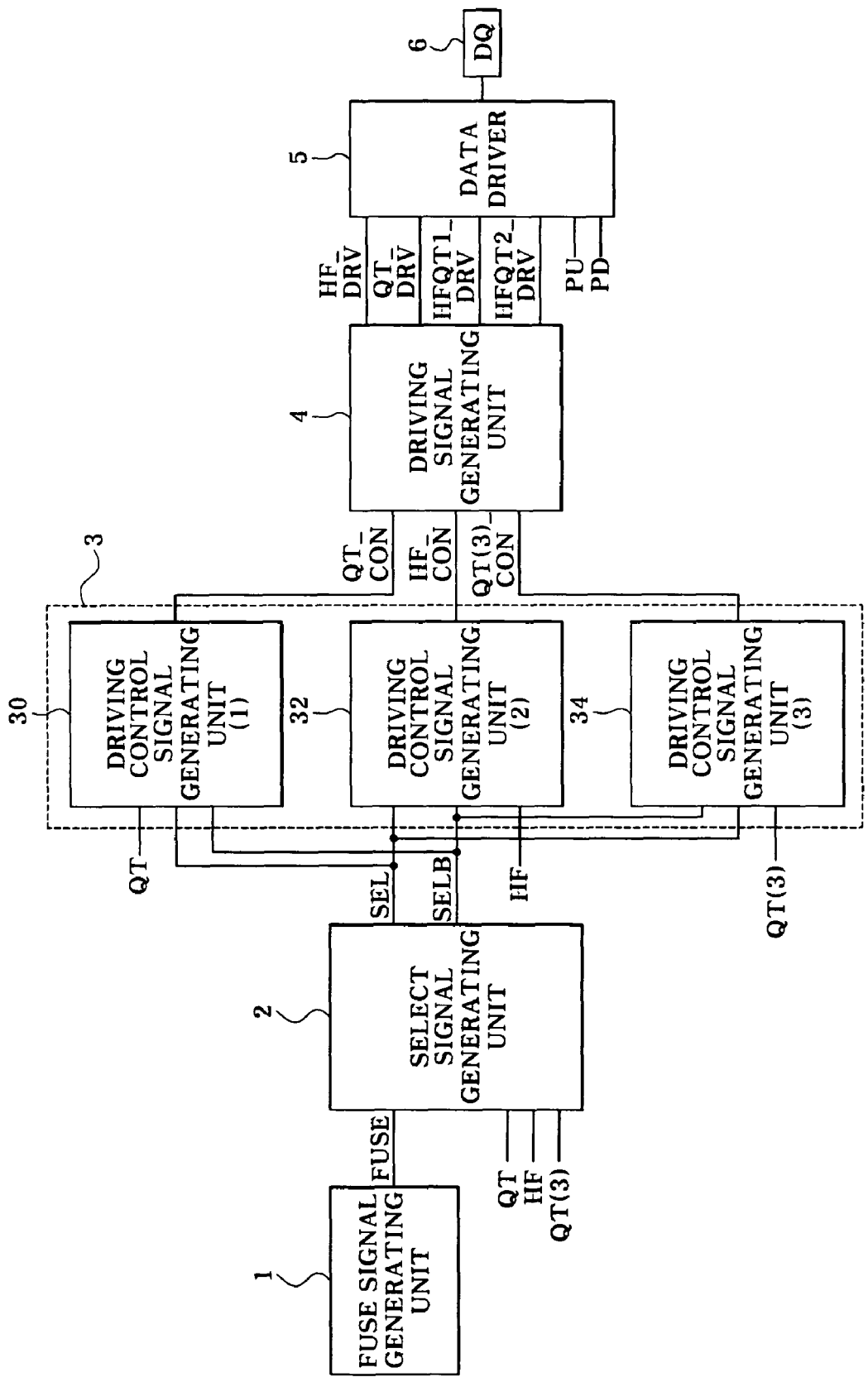
FIG. 1 is a block diagram illustrating a data output circuit according to an embodiment of this disclosure.

FIG. 1 is a block diagram illustrating a data output circuit according to an embodiment of this disclosure.

Referring to FIG. 1, the data output circuit includes a fuse signal generating unit 1, a select signal generating unit 2, a driving control signal generating unit 3, a driving signal generating unit 4, a data driver 5 and a data output pad 6. Here, the fuse signal generating unit 1, the select signal generating unit 2, the driving control signal generating unit 3 and the driving signal generating unit 4 are circuits provided to control the driving strength of the data driver 5.

Figure 2:
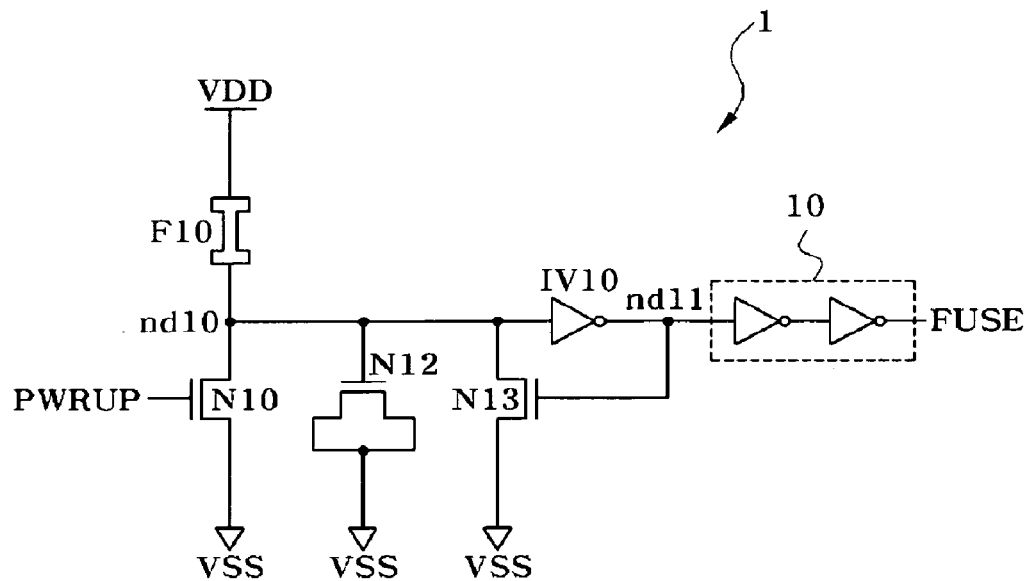
FIG. 2 is a circuit diagram illustrating a fuse signal generating unit included in the data output circuit of FIG. 1.

Referring to FIG. 2, the fuse signal generating unit 1 includes a fuse F10 connected between a power supply voltage VDD and a node nd10, an NMOS transistor N10 connected between the node nd10 and a ground voltage VSS to perform a pull-down operation at the node nd10 in response to a power-up signal PWRUP, an NMOS transistor N12 connected to the node nd10 as a capacitor, an inverter IV10 to invert a voltage signal on the node nd10 and then output an inverted signal to a node nd11, an NMOS transistor N13 to perform a pull-down operation at the node nd10 in response to a voltage signal on the node nd11, and a buffer 10 to output a fuse signal FUSE by buffering the voltage signal on the node nd11. The fuse signal generating unit 1 outputs the fuse signal FUSE in a low level when the fuse F10 is not cut and outputs the fuse signal FUSE in a high level when the fuse F10 is cut.

Figure 3:
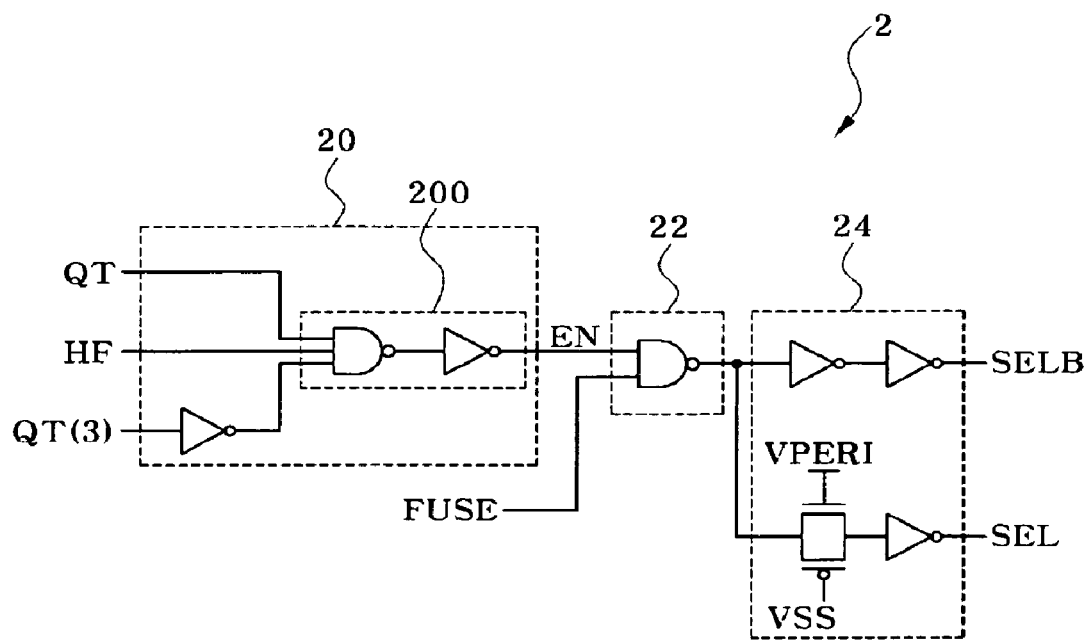
FIG. 3 is a circuit diagram illustrating a select signal generating unit included in the data output circuit of FIG. 1.

Referring to FIG. 3, the select signal generating unit 2 includes a set-up signal detecting unit 20 to receive first to third set-up signals QT, HF and QT(3) and then generate an enable signal EN, a logic unit 22 to perform a NAND operation of the enable signal EN and the fuse signal FUSE, and a buffer 24 to produce a select signal SEL and an inverted select signal SELB by buffering an output signal of the logic unit 22. Here, the first to third set-up signals QT, HF and QT(3) are signals which are set up based on EMRS (Extended Mode Register Set) signals to control the driving strength.

The set-up signal detecting unit 20 produces the enable signal EN, which is activated in a high level, when the first to third set-up signals QT, HF and QT(3) are of high, high and low levels, respectively. The logic unit 22 to receive the enable signal EN of the high level inverts the fuse signal FUSE. Accordingly, in a case that the fuse signal FUSE of a low level is inputted because the fuse F10 is not cut, the select signal generating unit 2 generates the select signal SEL of a low level and the inverted select signal SELB of a high level. On the other hand, in a case that the fuse signal FUSE of a high level is inputted because the fuse F10 is cut, the select signal generating unit 2 generates the select signal SEL of a high level and the inverted select signal SELB of a low level.

The driving control signal generating unit 3, as shown in FIG. 1, includes first to third driving control signal generating units 30, 32 and 34.

Figure 4:
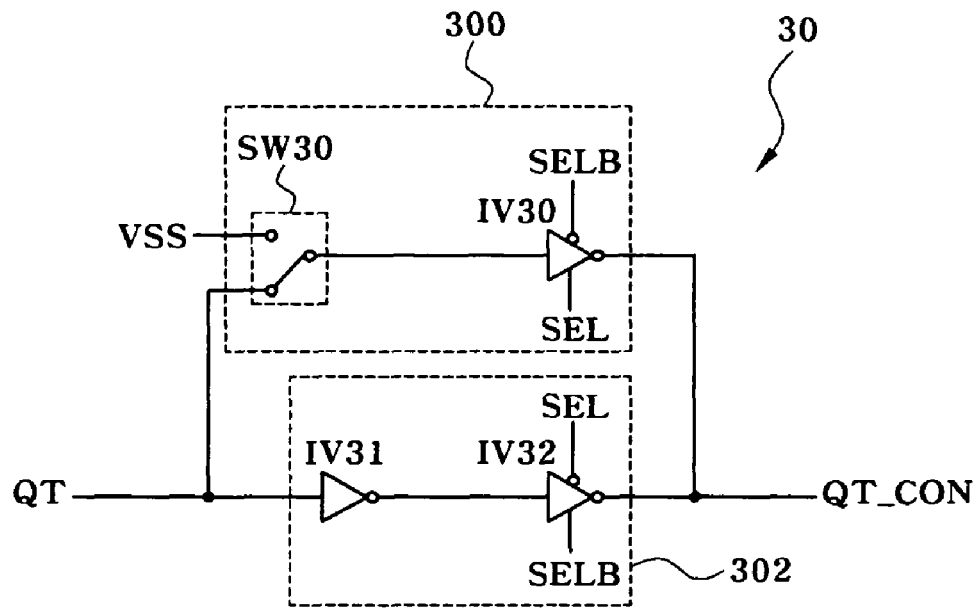
FIG. 4 is a circuit diagram illustrating a first driving control signal generating unit included in the data output circuit of FIG. 1.

Referring to FIG. 4, the first driving control signal generating unit 30 includes a first transfer unit 300 having a switch SW30 and an inverter IV30 in order to produce a first driving control signal QT_CON by inverting the first set-up signal QT in response to the select signal SEL and the inverted select signal SELB, and a second transfer unit 302 having inverters IV31 and IV32 in order to transfer the first set-up signal QT as the first driving control signal QT_CON in response to the select signal SEL and the inverted select signal SELB. The switch 30 selectively couples an input terminal of the first set-up signal QT to the inverter IV30 or blocks a signal path of the first transfer unit 300 by selectively coupling the ground voltage VSS to the inverter IV30. Further, the inverter IV30 operates in response to both the select signal SEL of the high level and the inverted select signal SELB of the low level and the inverter IV32 operates in response to both the select signal SEL of the low level and the inverted select signal SELB of the high level.

Figure 5:
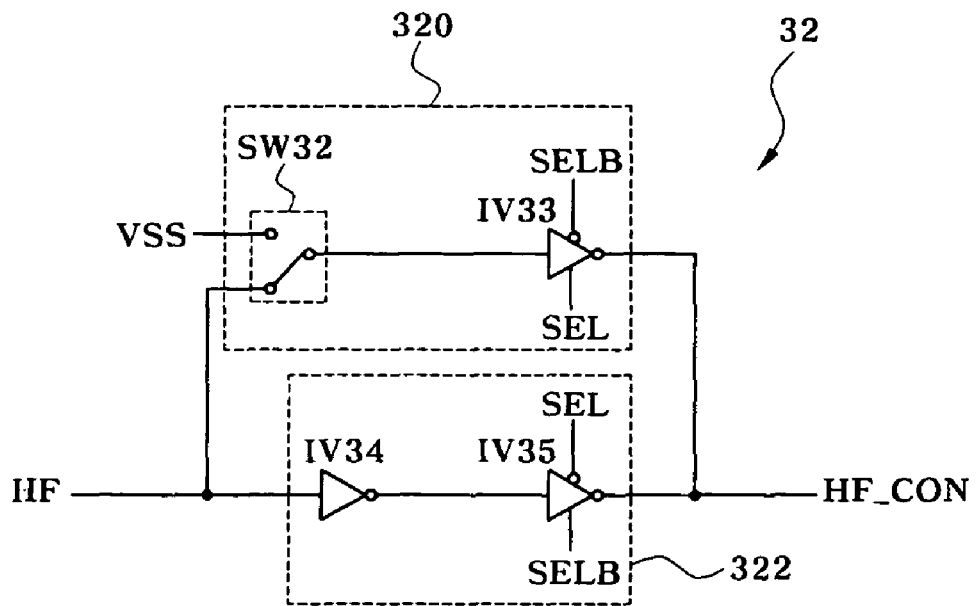
FIG. 5 is a circuit diagram illustrating a second driving control signal generating unit included in the data output circuit of FIG. 1.

Referring to FIG. 5, the second driving control signal generating unit 32 includes a third transfer unit 320 having a switch SW32 and an inverter IV33 in order to produce a second driving control signal HF_CON by inverting the second set-up signal HF in response to the select signal SEL and the inverted select signal SELB, and a fourth transfer unit 322 having inverters IV34 and IV35 in order to transfer the second set-up signal HF as the second driving control signal HF_CON in response to the select signal SEL and the inverted select signal SELB.

Figure 6:
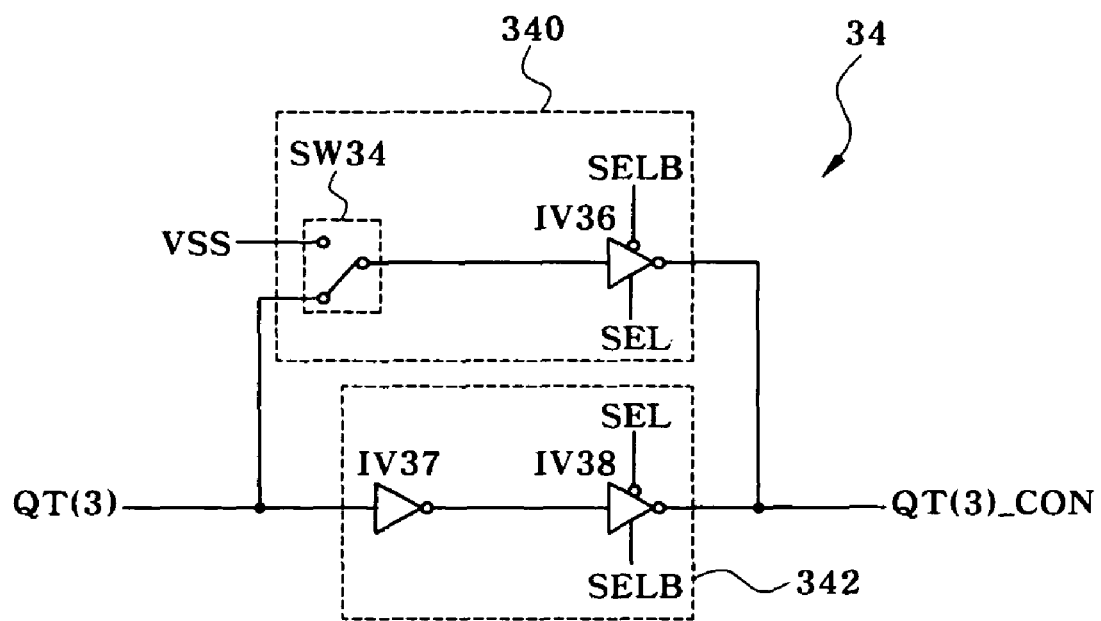
FIG. 6 is a circuit diagram illustrating a third driving control signal generating unit included in the data output circuit of FIG. 1.

Referring to FIG. 6, the third driving control signal generating unit 34 includes a fifth transfer unit 340 having a switch SW34 and an inverter IV36 in order to produce a third driving control signal QT(3)_CON by inverting the third set-up signal QT(3) in response to the select signal SEL and the inverted select signal SELB, and a sixth transfer unit 342 having inverters IV37 and IV38 in order to transfer the third set-up signal QT(3) as the third driving control signal QT(3)_CON in response to the select signal SEL and the inverted select signal SELB.

Figure 7:
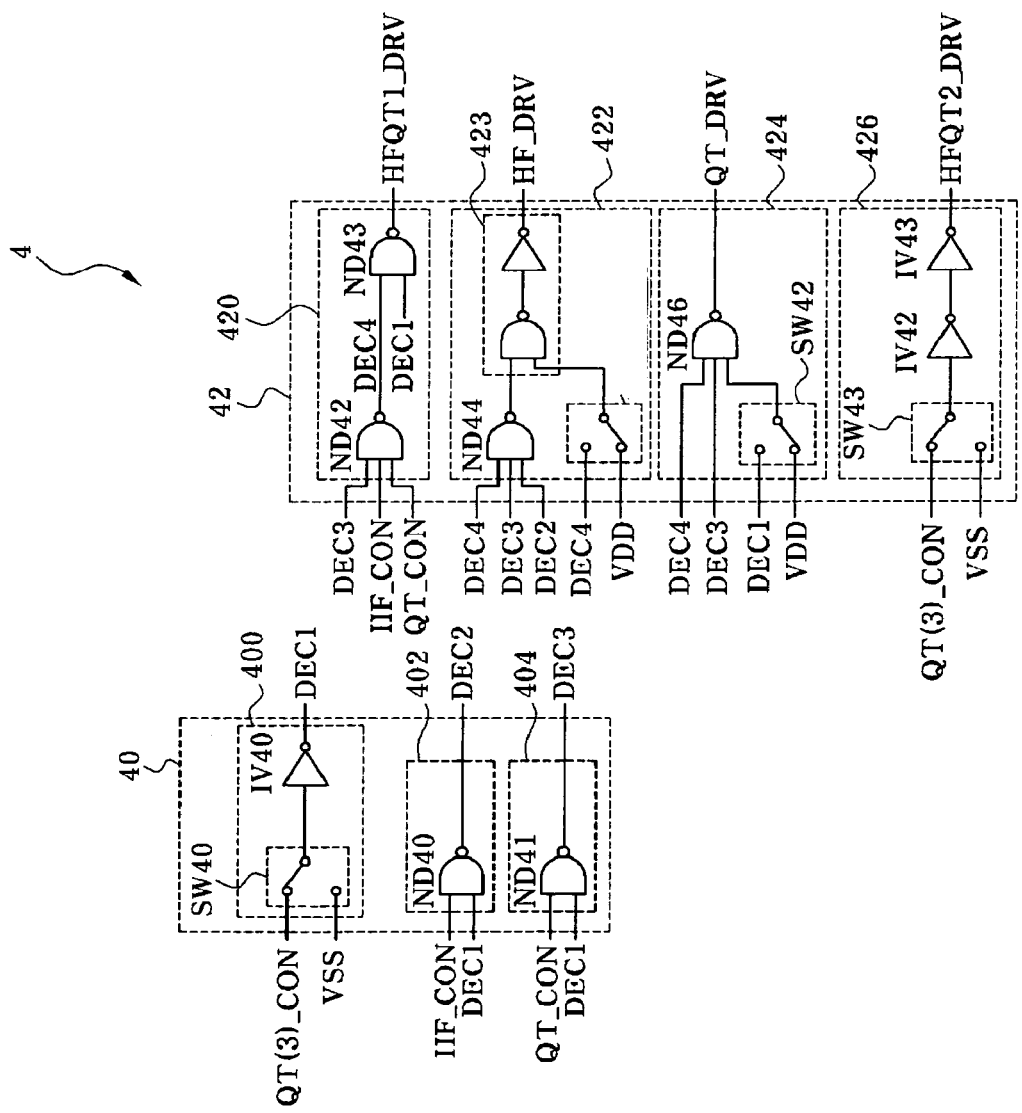
FIG. 7 is a circuit diagram illustrating a driving signal generating unit included in the data output circuit of FIG. 1.

Referring to FIG. 7, the driving signal generating unit 4 includes a pre-decoder 40 and a decoder 42.

The pre-decoder 40 includes a first pre-decoder 400 having a switch SW40 and an inverter IV40 to produce a first decoding signal DEC1 by inverting the third driving control signal QT(3)_CON, a second pre-decoder 402 having a NAND gate ND40 to produce a second decoding signal DEC2 by performing a NAND operation of the second driving control signal HF_CON and the first decoding signal DEC1, and a third pre-decoder 404 having a NAND gate ND41 to produce a third decoding signal DEC3 by performing a NAND operation of the first driving control signal QT_CON and the first decoding signal DEC1. The switch SW40 in the first pre-decoder 400 is selectively connected to a ground voltage level such that the first pre-decoder 400 can produce the first decoding signal DEC1 of a high level regardless of the third set-up signal QT(3).

The decoder 42 includes first to fourth decoders 420, 422, 424 and 426. The first decoder 420 includes a NAND gate ND42 to produce a fourth decoding signal DEC4 by performing a NAND operation of the third decoding signal DEC3, the first driving control signal QT_CON and the second driving control signal HF_CON, and a NAND gate ND43 to produce a third driving signal HFQT1_DRV by performing a NAND operation of the first and fourth driving signals DEC1 and DEC4.

The second decoder 422 includes a NAND gate ND44 to perform NAND operation of the second to fourth decoding signals DEC2 to DEC4, and a logic unit 423 to produce a first driving signal HF_DRV by selectively performing a AND operation of the power supply voltage VDD from a switch SW41 and an output signal of the NAND gate ND44 or performing a AND operation of the fourth decoding signal DEC4 from a switch SW41 and the output signal of the NAND gate ND44.

The third decoder 424 includes a NAND gate ND46 to produce a second driving signal QT_DRV by performing NAND operation of the third and fourth decoding signals DEC3 and DEC4 and the power supply voltage VDD or performing a NAND operation of the third and fourth decoding signals DEC3 and DEC4 and the first decoding signal DEC1 from a switch SW42

The fourth decoder 426 includes inverters IV42 and IV43 to produce the fourth driving signal HFQT2_DRV by buffering the third driving control signal QT(3)_CON from a switch SW43.

Figure 8:
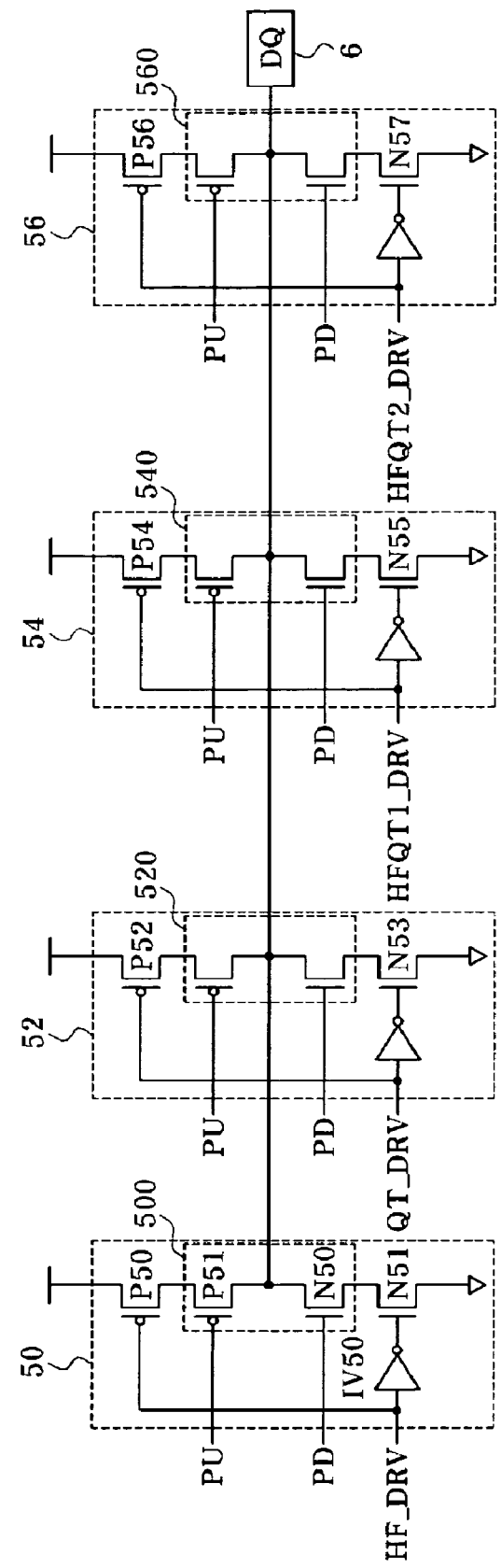
FIG. 8 is a circuit diagram illustrating a data driver included in the data output circuit of FIG. 1.

Referring to FIG. 8, the data driver 5 includes first to fourth driving units 50, 52, 54 and 56.

The first driving unit 50 includes a buffer 500 having a PMOS transistor P51 to perform a pull-up operation at the data output pad 6 in response to a pull-up signal PU and an NMOS transistor N50 to perform a pull-down operation at the data output pad 6 in response to a pull-down signal PD, and PMOS and NMOS transistors P50 and N51 to drive the buffer 500 in response to the first driving signal HF_DRV. The second driving unit 52 includes a buffer 520 and PMOS and NMOS transistors P52 and N53 to drive the buffer 520 in response to the second driving signal QT_DRV. The third driving unit 54 includes a buffer 540 and PMOS and NMOS transistors P54 and N55 to drive the buffer 540 in response to the third driving signal HFQT1_DRV. The fourth driving unit 56 includes a buffer 560 and PMOS and NMOS transistors P56 and N57 to drive the buffer 560 in response to the fourth driving signal HFQT2_DRV.

It is preferable that the sizes of the NMOS transistors and the PMOS transistors, which are included in the first to fourth driving units 50, 52, 54 and 56, are controlled in order that the second driving unit 52 has a half of the driving strength, which the first driving unit 50 has, and each of the third and fourth driving units 54 and 56 has a quarter of the driving strength, which the first driving unit 50 has. Accordingly, the driving strengths of the first to fourth driving units 50, 52, 54 and 56 are 50%, 25%, 12.5% and 12.5% of the total driving strength, respectively.

In this embodiment, the first to third set-up signals QT, HF and QT(3) are set up based on the EMRS (Extended Mode Register Set) signal as shown in Table <1>. For example, when the driving strength of the data driver 5 is controlled by the first driving strength FULL, all the first to third set-up signals QT, HF and QT(3) are set up to be of low levels and, when the driving strength of the data driver 5 is controlled by the third driving strength (¼, quarter), the first to third set-up signals QT, HF and QT(3) are set up to be of high, low and low levels, respectively. That is, the first to third set-up signals QT, HF and QT(3) can be set up in order that the driving strength of the data driver 5 can be controlled by the first driving strength (FULL), the second driving strength (½, Half), the third driving strength (¼, Quarter) and the fourth driving strength (⅛, Half Quarter).

TABLE 1

| DRIVING STRENGTH | QT | HF | QT(3) |
|---|---|---|---|
| FULL | L | L | L |
| ½ | L | H | L |
| ¼ | H | L | L |
| ⅛ | H | H | L |

The data output circuit according to the present invention controls, in the embodiment of FIG. 1, the data driver 5 such that the previously determined driving strength of the data driver 5 is changed into a different driving strength by using the first to third set-up signals QT, HF and QT(3) and the fuse signal FUSE which is produced by the cutting of the fuse F10. For example, the data driver 5 is controlled in such a manner that the data driver 5 can have the fifth driving strength (¾, Three Quarters) which is different from the previously determined driving strength (the fourth driving strength (⅛, Half Quarter)).

Hereinafter, the operation of the data output circuit according to the embodiment of the present invention will be described in detail referring to FIGS. 2 to 8. For convenience in illustration, a case where the data driver 5 is controlled by the fifth driving strength (¾, Three Quarters), instead of the fourth driving strength (⅛, Half Quarter), while the first to third set-up signals QT, HF and QT(3) set up to control the data driver 5 based on the fourth driving strength (⅛, Half Quarter) are inputted, will be exemplarily illustrated.

First, in order that the data driver 5 has the fifth driving strength (¾, Three Quarters), the fuse F10 in the fuse signal generating unit 1 of FIG. 2 is cut. Accordingly, the fuse signal FUSE outputted from the fuse signal generating unit 1 is in a high level.

Next, the select signal generating unit 2 receiving the fuse signal FUSE produces the select signal SEL and the inverted select signal SELB. At this time, as shown in FIG. 3, the set-up signal detecting unit 20 in the select signal generating unit 2 receives the first to third set-up signals QT, HF and QT(3) and produces the enable signal EN. The enable signal EN is in a high level when the first to third set-up signals QT, HF and QT(3) are of high, high and low levels, respectively. That is, in a state where the first to third set-up signals QT, HF and QT(3) are respectively set up to be of high, high and low levels, the select signal SEL of a high level and the inverted select signal SELB of a low level are produced when the fuse signal FUSE of a high level is inputted into the select signal generating unit 2. As mentioned above, in order that the select signal SEL is activated in a high level, the first to third set-up signals QT, HF and QT(3) has to be set up and the fuse signal FUSE of the high level has to be inputted.

The first driving control signal generating unit 30 (FIG. 4) to receive the select signal SEL of the high level and the inverted select signal SELB of the low level transfers the first driving control signal QT_CON by inverting the first set-up signal QT. Similarly, the second driving control signal generating unit 32 (FIG. 5) transfers the second driving control signal HF_CON by inverting the second set-up signal HF. The third driving control signal generating unit 34 (FIG. 6) transfers the third driving control signal QT(3)_CON by inverting the third set-up signal QT(3). Accordingly, the first to third driving control signals QT_CON, HF_CON and QT(3)_CON are set up to be of low, low and high levels, respectively.

In a case that the first to third set-up signals QT, HF and QT(3) are not set up to be of high, high and low levels, respectively, the first set-up signal QT is transferred as the first driving control signal QT_CON, the second set-up signal HF is transferred as the second driving control signal HF_CON, and the third set-up signal QT(3) is transferred as the third driving control signal QT(3)_CON. Accordingly, as shown in Table <2>, the set-up levels of the first to third driving control signals QT_CON, HF_CON and QT(3)_CON are the same as those of the first to third set-up signals QT, HF and QT(3). However, as mentioned above, in a case that the first to third set-up signals QT, HF and QT(3) are inputted to provide the fourth driving strength (⅛, Half Quarter) for the data driver 5, the first to third driving control signals QT_CON, HF_CON and QT(3)_CON are produced such that the data driver 5 has the fifth driving strength (¾, Three Quarters).

TABLE 2

| DRIVING STRENGTH | QT_CON | HF_CON | QT(3)_CON |
|---|---|---|---|
| FULL | L | L | L |
| ¾ | L | L | H |
| ½ | L | H | L |
| ¼ | H | L | L |

Next, referring to FIG. 7, the driving signal generating unit 4 receives the first to third driving control signals QT_CON, HF_CON and QT(3)_CON and produces the first driving signal HF_DRV, the second driving signal QT_DRV, the third driving signal HFQT1_DRV and the fourth driving signal HFQT2_DRV. As mentioned above, the driving signal generating unit 4 including the pre-decoder 40 and the decoder 42 produces the first to fourth driving signals HF_DRV, QT_DRV, HFQT1_DRV and HFQT2_DRV with a combination as shown in Table <3>. For example, in a case that the first to third set-up signals QT, HF and QT(3) are set up to be of low, low and low levels, respectively, in order that the data driver 5 has the first driving strength FULL, the first to third driving control signals QT_CON, HF_CON and QT(3)_CON are also set up to be of low, low and low levels, respectively and all the first to fourth driving signals HF_DRV, QT_DRV, HFQT1_DRV and HFQT2_DRV are in low levels.

TABLE 3

| DRIVING STRENGTH | HF_DRV | QT_DRV | HFQT1_DRV | HFQT2_DRV |
|---|---|---|---|---|
| FULL | L | L | L | L |
| ¾ | L | L | H | H |
| ½ | H | L | L | L |
| ¼ | L | H | L | L |
| ⅛ | H | H | H | L |

In the data output circuit according to the present invention, in a case that the first to third set-up signals QT, HF and QT(3)

to set up the fourth driving strength (⅛, Half Quarter) are inputted and the fuse F10 is cut, the voltage levels of the first to third driving control signals QT_CON, HF_CON and QT(3)_CON are set up to produce the fifth driving strength (¾, Three Quarters). Accordingly, the first to fourth driving signals HF_DRV, QT_DRV, HFQT1_DRV and HFQT2_DRV are of low, low, high and high levels, respectively.

Next, the data driver 5 of FIG. 8 drives the data output pad 6 in response to the first to fourth driving signals HF_DRV, QT_DRV, HFQT1_DRV and HFQT2_DRV. At this time, the driving units 50, 52, 54 and 56 included in the data driver 5 are driven by the first to fourth driving signals HF_DRV, QT_DRV, HFQT1_DRV and HFQT2_DRV, respectively.

For example, as mentioned above, in a case that the first to third set-up signals QT, HF and QT(3) which are set up to be of low, low and low levels, respectively, are inputted to have the first driving strength FULL, all the first to fourth driving signals HF_DRV, QT_DRV, HFQT1_DRV and HFQT2_DRV are produced in a low level and all the first to fourth driving units 50, 52, 54 and 56 are driven with the maximum driving strength of the data driver 5.

Meanwhile, in a case that the first to third set-up signals QT, HF and QT(3) which are set up to be of high, high and low levels, respectively, are inputted to have the fourth driving strength (⅛, Half Quarter) and the fuse F10 is cut, the first to fourth driving signals HF_DRV, QT_DRV, HFQT1_DRV and HFQT_DRV are produced in low, low, high and high levels, respectively, and the first and second driving units 50 and 52 are driven. The driving strength of the data driver 5 is the three quarters of the maximum driving strength. That is, the data driver 5 is driven with the fifth driving strength (¾, Three Quarters).

As mentioned above, the data output circuit according to the present invention, in a case that the first to third set-up signals QT, HF and QT(3) which are set up to control the data driver 5 with a previously set-up driving strength (for example, the fourth driving strength (⅛, Half Quarter) are inputted, the first to third driving control signals QT_CON, HF_CON, QT(3)_CON are produced and the first to fourth driving signals HF_DRV, QT_DRV, HFQT1_DRV and HFQT2_DRV are produced by them. As a result, the driving strength of the data driver 5 is effectively controlled based on user's demand.

The data output circuit according to the present invention is not limited to the embodiment mentioned above. The data driver can be controlled with various driving strengths. For example, the data driver 5 has different driving strengths by controlling the voltage levels of the first to fourth driving control signals QT_CON, HF_CON and QT(3)_CON, which are respectively generated by the first to third driving control signal generating units 30, 32 and 34, through the modification of interconnections between the switches SW30, SW32 and SW34.

Further, in a case that the first to third set-up signals QT, HF and QT(3) which are set up to control the data driver 5 with the fourth driving strength (⅛, Half Quarter) are inputted, the set-up signal detecting unit 20 produces the enable signal EN of a high level. That is, the set-up signal detecting unit 20 has a structure in which the enable signal EN is produced to control the data driver 5 in the fifth driving strength (¾, Three Quarters) by using the first to third set-up signals QT, HF and QT(3) which are set up to control the data driver 5 in the fourth driving strength (⅛, Half Quarter). Accordingly, the driving strengths can be generated variously based on an appropriate combination of the first to third set-up signals QT, HF and QT(3).

While the present invention has been described with respect to the particular examples and embodiments, it will be apparent to those skilled in the art that various changes and modifications may be made without departing from the spirit and scope of the disclosure and the following claims.

This disclosure claims priority to Korean application number 10-2008-0024580, filed on Mar. 17, 2008, the entire contents of which are incorporated herein by reference in its entirety.

What is claimed is:

1. A semiconductor device having a driving strength control circuit, the driving strength control circuit comprising:
   a fuse signal generating unit for generating a fuse signal based on fuse cutting;
   a select signal generating unit for generating select signals in response to the fuse signal;
   a driving control signal generating unit configured to alternatively transfer set-up signals, or an inverted signal of the set-up signals, as driving control signals in response to the select signals; and
   a driving signal generating unit for generating driving signals by decoding the driving control signals.

2. The semiconductor device of claim 1, wherein the fuse signal generated by the fuse signal generating unit is activated when a fuse is cut.

3. The semiconductor device of claim 1, wherein the fuse signal generating unit includes:
   a fuse connected between a power supply voltage terminal and a first node;
   a first pull-down element connected between the first node and a ground voltage terminal for performing a pull-down operation at the first node in response to a power-up signal;
   an inverter for inverting a voltage signal on the first node and outputting an inverted signal to a second node;
   a second pull-down element for performing a pull-down operation at the first node in response to a voltage signal on the second node; and
   a buffer for outputting the fuse signal by buffering the voltage signal on the second node.

4. The semiconductor device of claim 1, wherein the select signal generating unit includes:
   a set-up signal detecting unit for receiving first to third set-up signals of the set-up signals and then generate an enable signal;
   a logic unit for controlling a transmission of the fuse signal in response to the enable signal; and
   a buffer for producing the select signals and an inverted select signal by buffering an output signal of the logic unit.

5. The semiconductor device of claim 4, wherein the enable signal generated by the set-up signal detecting unit is activated when the first to third set-up signals are inputted according to a predetermined combination.

6. The semiconductor device of claim 4, wherein the logic unit performs a NAND operation of the enable signal and the fuse signal.

7. The semiconductor device of claim 4, wherein the driving control signal generating unit includes:
   a first driving control signal generator for generating a first driving control signal of the driving control signals from the first set-up signal in response to the select signals;

a second driving control signal generator for generating a second driving control signal of the driving control signals from the second set-up signal in response to the select signals; and
a third driving control signal generator for generating a third driving control signal of the driving control signals from the third set-up signal in response to the select signals.

8. The semiconductor device of claim 7, wherein the first driving control signal generator includes:
a first transfer unit for inverting the first set-up signal and transferring an inverted signal of the first set-up signal, as the first driving control signal, in response to the select signals; and
a second transfer unit for transferring the first set-up signal, as the first driving control signal, in response to the select signals,
wherein the first set-up signal and the inverted signal of the first set-up signal are transferred as the first driving control signal in an alternating manner.

9. The semiconductor device of claim 8, wherein the first transfer unit includes:
a switch for selectively transferring the first set-up signal or a ground voltage; and
an inverter driven by the select signals, for inverting an output signal of the switch.

10. The semiconductor device of claim 7, wherein the second driving control signal generator includes:
a first transfer unit for inverting the second set-up signal and transferring an inverted signal of the second set-up signal, as the second driving control signal, in response to the select signals; and
a second transfer unit for transferring the second set-up signal, as the second driving control signal, in response to the select signals,
wherein the second set-up signal and the inverted signal of the second set-up signal are transferred as the second driving control signal in an alternating manner.

11. The semiconductor device of claim 10, wherein the first transfer unit includes:
a switch for selectively transferring the second set-up signal or a ground voltage; and
an inverter driven by the select signals, for inverting an output signal of the switch.

12. The semiconductor device of claim 7, wherein the third driving control signal generator includes:
a first transfer unit for inverting the third set-up signal and transferring an inverted signal of the third set-up signal, as the third driving control signal, in response to the select signals; and
a second transfer unit for transferring the third set-up signal, as the third driving control signal, in response to the select signals,
wherein the third set-up signal and the inverted signal of the third set-up signal are transferred as the third driving control signal in an alternating manner.

13. The semiconductor device of claim 12, wherein the first transfer unit includes:
a switch for selectively transferring the third set-up signal or a ground voltage; and
an inverter driven by the select signals, for inverting an output signal of the switch.

14. The semiconductor device of claim 1, wherein the driving control signals include first to third driving control signals, wherein the driving signals include first to fourth driving signals, and wherein the driving signal generating unit includes:

a pre-decoder for generating first to third decoding signals by pre-decoding the first to third driving control signals; and
a decoder for generating the first to fourth driving signals by decoding the first to third decoding signals and the first to third driving control signals.

15. The semiconductor device of claim 14, wherein the pre-decoder includes:
a first pre-decoder for generating the first decoding signal by inverting the third driving control signal;
a second pre-decoder for generating the second decoding signal by performing a logic operation of the second driving control signal and the first decoding signal; and
a third pre-decoder for generating the third decoding signal by performing a logic operation of the first driving control signal and the first decoding signal.

16. The semiconductor device of claim 15, wherein the first pre-decoder includes:
a switch for selectively transferring the third driving control signal or a ground voltage; and
an inverter for inverting an output signal of the switch.

17. The semiconductor device of claim 15, wherein the decoder includes a first decoder and wherein the first decoder includes:
a first logic element for generating a fourth decoding signal by using the third decoding signal and the first and second driving control signals; and
a second logic element for generating the third driving signal by using the first decoding signal and the fourth decoding signal.

18. The semiconductor device of claim 17, wherein the decoder further includes:
a second decoder for generating the first driving signal in response to the second to fourth decoding signals;
a third decoder for generating the second driving signal by using the first, third and fourth decoding signals; and
a fourth decoder for generating the fourth driving signal by using the third driving control signal.

19. The semiconductor device of claim 18, wherein the second decoder includes:
a logic element for performing a logic operation of the second to fourth decoding signals;
a switch for selectively transferring the fourth decoding signal or a power supply voltage; and
a logic unit for performing a logic operation of an output signal of the logic element and an output signal of the switch.

20. The semiconductor device of claim 18, wherein the third decoder performs a NAND operation of the first, third and fourth decoding signals.

21. The semiconductor device of claim 18, wherein the fourth decoder includes:
a switch for selectively transferring the third driving control signal or a ground voltage; and
a buffer unit for buffering an output signal of the switch.

22. The semiconductor device of claim 1, wherein the set-up signals are set up by an EMRS (Extended Mode Register Set) signal.

23. A semiconductor device having a data output circuit, the data output circuit comprising:
a driving strength control unit for receiving set-up signals which are set up by an EMRS (Extended Mode Register Set) signal, transferring the set-up signals or an inverting signal alternatingly as driving control signals based on fuse cutting, and generating driving signals by decoding the driving control signals;

a data driver for receiving the driving signals, wherein a driving strength of the data driver is controlled based on the driving signals; and a data output pad for outputting data which are driven by the data driver.

24. The semiconductor device of claim 23, wherein the data driver includes first and second driving units to drive the data in response to pull-up and pull-down signals, wherein the driving signals include first and second driving signals, and wherein the first and second driving units are respectively driven in response to the first and second driving signals.

25. The semiconductor device of claim 23, wherein the driving strength control unit includes:

a fuse signal generating unit for generating a fuse signal based on the fuse cutting;

a select signal generating unit for generating select signals in response to the fuse signal;

a driving control signal generating unit for receiving first to third set-up signals of the set-up signals and generate the driving control signals in response to the select signals; and a driving signal generating unit for generating the driving signals by decoding the driving control signals.

26. The semiconductor device of claim 25, wherein the fuse signal generated by the fuse signal generating unit is activated when the fuse is cut.

27. The semiconductor device of claim 25, wherein the select signal generating unit includes:

a set-up signal detecting unit for receiving the first to third set-up signals and then generate an enable signal which is activated when the first to third set-up signals are inputted according to a predetermined combination;

a logic unit for controlling a transmission of the fuse signal in response to the enable signal; and a buffer for producing the select signals by buffering an output signal of the logic unit.

28. The semiconductor device of claim 27, wherein the driving control signal generating unit includes:

a first driving control signal generator for generating a first driving control signal of the driving control signals from the first set-up signal in response to the select signals;

a second driving control signal generator for generating a second driving control signal of the driving control signals from the second set-up signal in response to the select signals; and a third driving control signal generator for generating a third driving control signal of the driving control signals from the third set-up signal in response to the select signals.

29. The semiconductor device of claim 28, wherein the first driving control signal generator includes:

a first transfer unit for inverting the first set-up signal and transferring an inverted signal of the first set-up signal, as the first driving control signal, in response to the select signals; and a second transfer unit for transferring the first set-up signal, as the first driving control signal, in response to the select signals, wherein the first set-up signal and the inverted signal of the first set-up signal are transferred as the first driving control signal in an alternating manner.

30. The semiconductor device of claim 28, wherein the second driving control signal generator includes:

a first transfer unit for inverting the second set-up signal and transferring an inverted signal of the second set-up signal, as the second driving control signal, in response to the select signals; and a second transfer unit for transferring the second set-up signal, as the second driving control signal, in response to the select signals, wherein the second set-up signal and the inverted signal of the second set-up signal are transferred as the second driving control signal in an alternating manner.

31. The semiconductor device of claim 28, wherein the third driving control signal generator includes:

a first transfer unit for inverting the third set-up signal and transferring an inverted signal of the third set-up signal, as the third driving control signal, in response to the select signals; and a second transfer unit for transferring the third set-up signal, as the third driving control signal, in response to the select signals, wherein the third set-up signal and the inverted signal of the third set-up signal are transferred as the third driving control signal in an alternating manner.

32. The semiconductor device of claim 25, wherein the driving control signals include first to third driving control signals, wherein the driving signals include first to fourth driving signals, and wherein the driving signal generating unit includes:

a pre-decoder for generating first to third decoding signals by pre-decoding the first to third driving control signals; and a decoder for generating the first to fourth driving signals by decoding the first to third decoding signals and the first to third driving control signals.

33. The semiconductor device of claim 32, wherein the pre-decoder includes:

a first pre-decoder for generating the first decoding signal by inverting the third driving control signal;

a second pre-decoder for generating the second decoding signal by performing a logic operation of the second driving control signal and the first decoding signal; and a third pre-decoder for generating the third decoding signal by performing a logic operation of the first driving control signal and the first decoding signal.

34. The semiconductor device of claim 33, wherein the first pre-decoder includes:

a switch for selectively transferring the third driving control signal or a ground voltage; and an inverter for inverting an output signal of the switch.

35. The semiconductor device of claim 33, wherein the decoder includes a first decoder and wherein the first decoder includes:

a first logic element for generating a fourth decoding signal by using the third decoding signal and the first and second driving control signals; and a second logic element for generating the third driving signal by using the first decoding signal and the fourth decoding signal.

36. The semiconductor device of claim 35, wherein the decoder further includes:

a second decoder for generating the first driving signal in response to the second to fourth decoding signals;

a third decoder for generating the second driving signal by using the first, third and fourth decoding signals; and a fourth decoder for generating the fourth driving signal by using the third driving control signal.

37. The semiconductor device of claim 36, wherein the second decoder includes:

a logic element for performing a logic operation of the second to fourth decoding signals;

a switch for selectively transferring the fourth decoding signal or a power supply voltage; and a logic unit for performing a logic operation of an output signal of the logic element and an output signal of the switch.

38. The semiconductor device of claim 36, wherein the fourth decoder includes:

a switch for selectively transferring the third driving control signal or a ground voltage; and a buffer unit for buffering an output signal of the switch.

* * * * *